(12) United States Patent
Hirler et al.

(10) Patent No.: US 9,553,178 B2
(45) Date of Patent: Jan. 24, 2017

(54) SEMICONDUCTOR COMPONENT WITH AN EMITTER CONTROL ELECTRODE

(75) Inventors: Franz Hirler, Isen (DE); Anton Mauder, Kolbermoor (DE); Frank Pfirsch, Munich (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 558 days.

(21) Appl. No.: 12/977,755

(22) Filed: Dec. 23, 2010

(65) Prior Publication Data

US 2011/0156095 A1    Jun. 30, 2011

(30) Foreign Application Priority Data

Dec. 28, 2009    (DE) .................. 10 2009 055 328

(51) Int. Cl.
| | |
|---|---|
| *H01L 29/66* | (2006.01) |
| *H01L 29/739* | (2006.01) |
| *H01L 29/06* | (2006.01) |
| *H01L 29/423* | (2006.01) |

(52) U.S. Cl.
CPC ....... *H01L 29/7397* (2013.01); *H01L 29/0696* (2013.01); *H01L 29/4236* (2013.01)

(58) Field of Classification Search
CPC ................................. H01L 29/42308

USPC .................. 257/348, E29.066, E29.059, 139
See application file for complete search history.

(56) References Cited

U.S. PATENT DOCUMENTS

| | | | | |
|---|---|---|---|---|
| 6,236,088 | B1 * | 5/2001 | Nielson et al. ............... | 257/355 |
| 6,566,708 | B1 * | 5/2003 | Grover et al. ................ | 257/330 |
| 2008/0012040 | A1 * | 1/2008 | Saito et al. .................... | 257/133 |
| 2009/0218617 | A1 * | 9/2009 | Kinzer .......................... | 257/330 |
| 2009/0283798 | A1 * | 11/2009 | Tsuzuki et al. ............... | 257/140 |
| 2012/0012924 | A1 * | 1/2012 | Meiser ............. | H01L 29/42392 |
| | | | | 257/330 |

* cited by examiner

*Primary Examiner* — Hsin-Yi Hsieh
(74) *Attorney, Agent, or Firm* — Murphy, Bilak & Homiller, PLLC

(57) ABSTRACT

A semiconductor component includes a first emitter zone of a first conductivity type, a second emitter zone of a second conductivity type, a first base zone arranged between the first and second emitter zones and a first control structure. The first control structure includes a control electrode arranged adjacent the first emitter zone, the control electrode being insulated from the first emitter zone by a first dielectric layer and extending in a current flow direction of the semiconductor component. The first control structure includes a first control connection and at least one first connection zone arranged between the first control connection and the control electrode and comprising a semiconductor material.

10 Claims, 8 Drawing Sheets

SEMICONDUCTOR COMPONENT WITH AN EMITTER CONTROL ELECTRODE

PRIORITY CLAIM

This application claims priority from German Patent Application No. 10 2009 055 328.2 filed on 28 Dec. 2009, the content of said application incorporated herein by reference in its entirety.

FIELD OF TECHNOLOGY

The present application relates to a semiconductor component, in particular a bipolar component, such as e.g., an IGBT (insulated gate bipolar transistor), a diode or a thyristor.

BACKGROUND

Bipolar components have two emitters doped complementarily to one another and at least one base zone, which is more lightly doped than the emitters and is arranged between the emitters. When the component is in the on state, charge carriers are emitted into the base zone by the emitters, as a result of which a charge carrier plasma is formed in the base zone. When the component is turned off, the charge carriers that form the charge carrier plasma have to be removed from the base zone, which leads to turn-off losses.

IGBTs usually have an n-type source zone, which, by means of an inversion channel controlled via a gate electrode, serves as an electron source and can therefore be considered analogous to an n-type emitter in its function. The n-type source zone is separated from an n-type base zone by a p-type base zone or p-type body zone. An IGBT additionally comprises a p-type emitter, which is arranged on a side of the n-type base remote from the p-type body zone. In the case of an IGBT, the charge carrier plasma density in the n-type base is determined by the efficiency of the p-type emitter, in particular. In this case, a high emitter efficiency means a low forward voltage when the component is in the on state, but also leads to high turn-off losses upon turn-off. This is due to the fact that the charge carriers stored in the n-type base in the on state have to flow, upon turn-off, through the space charge zone established in the off state, which leads to turn-off losses.

In order to reduce turn-off losses, in the case of an IGBT, in addition to a gate electrode controlling a channel in the p-type base, a further control electrode can be provided, which serves to short-circuit or bridge the p-type emitter shortly before the component is actually turned off. The p-type emitter thus becomes inactive, as a result of which the density of the charge carrier plasma is reduced before the component is actually turned off.

When the component is in the off state, the n-type emitter or the n-type source and the p-type emitter are at different electrical potentials. These electrical potentials can differ by up to a few 100 V or up to a few kV depending on the dielectric strength of the component. Accordingly, in the case of conventional IGBTs having two control structures, two separate drive circuits are required. The first drive circuit serves to generate a drive voltage for the gate electrode, the drive voltage being relative to the potential of the n-type emitter or of the n-type source. The second drive circuit serves to generate a drive voltage for the additional control electrode, the drive voltage being relative to the electrical potential of the p-type emitter. These two drive circuits have to be electrically insulated from one another in a suitable manner in order to avoid voltage flashovers.

SUMMARY

A bipolar semiconductor component such as e.g., an IGBT, diode, thyristor, etc. is provided with a low on resistance in the on state and in which low turn-off losses occur upon the transition from the on state to the off state and which can be realized in a simple and cost-effective manner.

A semiconductor component in accordance with one exemplary embodiment includes a first emitter zone of a first conductivity type, a second emitter zone of a second conductivity type, and a first base zone arranged between the first and second emitter zones. The component further includes a first control structure having a control electrode, a first control connection and at least one first connection zone arranged between the first control connection and the control electrode and composed of a semiconductor material. The control electrode is arranged adjacent the first emitter zone, insulated from the first emitter zone by a first dielectric layer and extends in a current flow direction of the semiconductor component.

The first connection zone comprises, in particular, a monocrystalline semiconductor material and doped in such a way that the first connection zone is fully depletable. In this context, "fully depletable" means that, when all dopant charges present in the first connection zone are ionized, the electric field strength occurring in the first connection zone does not reach a critical field strength value $E_{crit}$ at which an avalanche breakdown commences.

The first emitter can be bridged by the first control electrode to reduce the efficiency of the first emitter, which can be expedient, particularly before the component is turned off, in order to reduce turn-off losses. An electrical potential suitable for bridging the first emitter can be applied to the first control electrode via the first connection zone. When the component is in the off state, the connection zone can take up a reverse voltage, and thus "shields" the control connection from the electrical potential of the first emitter zone. In the case of a semiconductor component embodied as an IGBT, which additionally includes a base zone of the first conductivity type, also referred to as a body zone, between the second emitter zone and the first base zone and a gate electrode arranged adjacent the second base zone. Circuit components for generating a drive potential for the gate electrode and for generating a drive potential for the first control electrode can be integrated in a common circuit. The circuit can be, in particular, a circuit that generates drive signals relative to the potential of the second emitter zone.

The above-explained embodiments for reducing the efficiency of a first emitter is not restricted to use in an IGBT, and can also be employed in other bipolar components, such as e.g., in diodes or thyristors.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
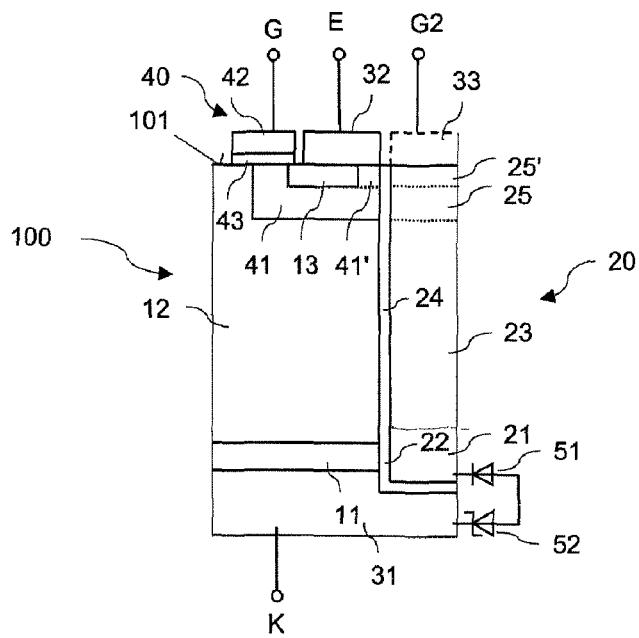
FIG. 1 illustrates a cross-sectional schematic view of a first exemplary embodiment of a semiconductor component realized as an IGBT.

FIG. 1 schematically shows an excerpt of a cross section through a semiconductor component embodied as an IGBT. The semiconductor component includes a first emitter zone 11 of a first conductivity type, a second emitter zone 13 of a second conductivity type complementary to the first conductivity type, the second emitter zone also referred to herein as a source zone and arranged in a manner spaced apart from the first emitter zone 11, and a first base zone 12 of the second conductivity type. The first base zone 12 is arranged between the first emitter zone 11 and the second emitter zone 13. In this case, the first base zone 12 is more lightly doped than the first or second emitter zones 11, 13. Doping concentrations of the first and second emitter zones 11, 13 can be for example in the range of $10^{15}$ cm$^{-3}$ to $10^{21}$ cm$^{-3}$, where the first emitter zone 11 can be more lightly doped than the second emitter zone 13. A doping concentration of the first base zone 12 can be for example in the range of $10^{12}$ cm$^{-3}$ to $10^{15}$ cm$^{-3}$. The doping concentration of the first base zone 12 and the dimensions thereof in the current flow direction of the component in this case determine the dielectric strength of the component.

The IGBT illustrated in FIG. 1 additionally includes a control structure 40 having a second base zone 41, also referred to herein as a body zone. The second base zone 41 is arranged between the second emitter or the source zone 13 and the first base zone 12. In the case of an IGBT, the first base zone 12 is also referred to as a drift zone. The control structure 40 further includes a control electrode 42, also referred to herein as a gate electrode. The control electrode 42 is insulated from the body zone 41 by a dielectric layer 43, and extends adjacent the body zone 41 from the second emitter zone 13 as far as the first base zone 12. The dielectric layer 43 is also referred to herein as a gate electric. The body zone 41 is more lightly doped than the second emitter zone 11. The doping concentration of the body zone 41 can be for example in the range of $10^{15}$ cm$^{-3}$ to $10^{19}$ cm$^{-3}$.

The first and second emitter zones 11, 13 and also the first base zone 12 and the body zone 41 can be, in particular, monocrystalline semiconductor zones, and are arranged in a semiconductor body 100. The component illustrated in FIG. 1 is a vertical component. In the case of this component, the first and second emitter zones 11, 13 are arranged in a manner spaced apart from one another in a vertical direction of the semiconductor body 100. The first base zone 12 and the body zone 41 are correspondingly arranged at least in sections in this vertical direction between the first and second emitter zones 11, 13. In the case of the component illustrated in FIG. 1, the gate electrode 42 is realized as a planar gate electrode arranged above a first side 101, also referred to herein as a front side, of the semiconductor body 100. In the case of this component, the first base zone 12 and the body zone 41 extend in sections as far as the front side 101. The use of a planar gate electrode should be understood merely as an example. The control structure 40 can also be realized with a trench electrode, as will be explained below by way of example with reference to FIGS. 5 and 9.

The first emitter zone 11 is contact-connected by a first connection electrode 31, which forms a collector connection K of the component. The second emitter zone 13 is contact-connected by a second connection electrode 32, which forms an emitter connection of the component and which, in the embodiment illustrated, is arranged above the front side 101 of the semiconductor body 100. In the case of the component illustrated, the second connection electrode 32 also makes contact with the body zone 41. Optionally, the body zone 41 has a more highly doped connection zone 41' in the region of connection to the second connection electrode 32. The doping concentration of the connection zone 41' can be up to $10^{21}$ cm$^{-3}$.

The connection electrodes 31, 32 comprise a highly electrically conductive material, such as e.g., Al, Cu, Ti, Ta, W, Ni, Ag, Au or of compounds of these elements. The electrodes 31, 32 can be formed, in particular, as layer stacks having a plurality of different layers of the above-mentioned materials and/or compounds, in order to meet the different requirements with regard to electrical contact with the semiconductor body 100, barrier function against the penetration of undesirable elements into the semiconductor body 100, and good connectability to the external connections such as e.g., soldering or wire bonding connections. The first and second connection electrodes 31, 32 can be realized differently, in particular.

The component comprises a further control structure 20 having a further control electrode 21 arranged adjacent the first emitter zone 11. The further control electrode 21 is dielectrically insulated from the first emitter zone 11 and the first connection electrode 31 by a further dielectric layer 22 and extends in the current flow direction of the component from the first base zone 12 as far as the first connection electrode 31 or right into the first connection electrode 31. The further control electrode 21 is also be referred to herein as an emitter control electrode. In the case of the vertical semiconductor component illustrated in FIG. 1, the current flow direction is a vertical direction of the semiconductor body, that is to say a direction running perpendicularly to the front side 101. It should be noted in this context that the current can also flow in sections in a lateral direction, yet the main current direction of the component is nevertheless the vertical direction, that is to say the direction in which the first and second emitters 11, 13 are arranged in a manner spaced apart from one another.

The further control structure 20 also includes a control connection G2 and at least one first connection zone 23 arranged between the control connection G2 and the further control electrode 21. The first connection zone 23 comprises a semiconductor material, e.g., a monocrystalline semiconductor material. In this case, a doping concentration of the first connection zone 23 is chosen, in particular, in such a way that the connection zone 23 is fully depletable, in other words dopant charges present in the first connection zone 23 can be fully ionized without the critical field strength $E_{crit}$ occurring in the first connection zone 23.

Optionally, the component includes a second connection zone 25 (illustrated in a dashed fashion) arranged between the first connection zone 23 and the control connection G2. The second connection zone 25 is optionally contact-connected by a third connection electrode 33, which in this case forms the further control connection G2. Optionally, a more highly doped connection zone 25' is present in the region of connection to the third connection electrode 33. In the example illustrated, the second connection zone 25 is arranged in such a way that it separates the first connection zone 23 from the third connection electrode 33. Optionally, the second connection zone 25 can be formed so that the first connection zone 23 extends in sections as far as the third connection electrode 33, where a more highly doped connection zone can be arranged between the second connection zone 23 and the third connection electrode 33.

The optional second connection zone 25 can be doped complementarily to the first connection zone 23. In the case of the component illustrated in FIG. 1, the first connection zone 23 and the optional second connection zone 25 are arranged adjacent the first base zone 12 and the body zone 41, respectively, and are dielectrically insulated from these component zones by a further dielectric layer 24. In the case of this component, the optional third connection electrode 33 is arranged above the front side 101 of the semiconductor body. It should be noted in this context that the first connection zone 23 can be of the same conductivity type as the first base zone 12, and the second connection zone 25 can be of the same conductivity type as the body zone 41. During production of the component, the first connection zone 23 can be formed by the same processes as the first base zone 12, and the second connection zone 25 can be formed by the same processes as the body zone 41. In this case, the doping concentration of the first connection zone 23 corresponds to that of the first base zone 12, and the doping concentration of the second connection zone 25 corresponds to that of the body zone 41. The connection zone 25' of the second connection zone 25 can be formed by the same processes as the connection zone 41' of the body zone 41.

In the case of the component illustrated in FIG. 1, the further control electrode 21 and the first connection zone 23 are realized by a common semiconductor zone, that is to say the further control electrode 21 and the first connection zone 23 are in this case each semiconductor zones with identical doping.

Figure 2:
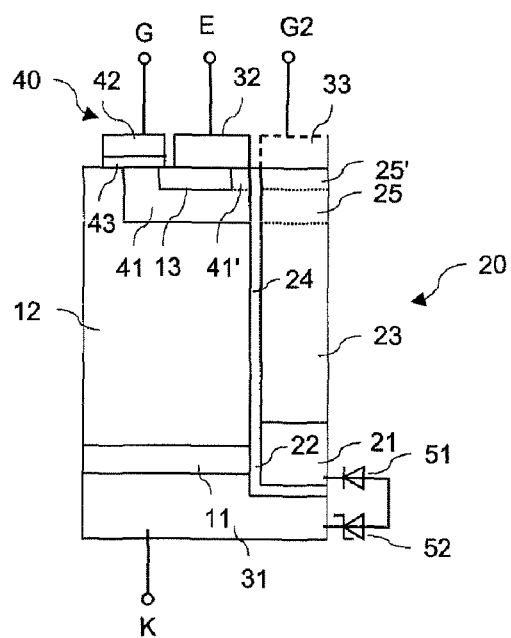
FIG. 2 illustrates a cross-sectional schematic view of a second exemplary embodiment of a semiconductor component embodied as an IGBT.

Referring to FIG. 2, which illustrates a modification of the component illustrated in FIG. 1, the further control electrode 21 can be formed from an electrically highly conductive material, such as e.g., a metal, a highly doped polycrystalline semiconductor material, such as e.g., polysilicon, or a highly doped monocrystalline semiconductor material.

Figure 3:
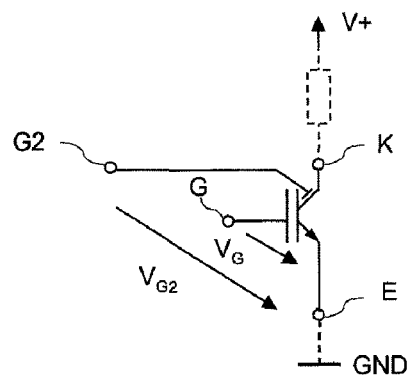
FIG. 3 shows the electrical circuit symbol of an IGBT illustrated in FIGS. 1 and 2 and an embodiment of a interconnection of the IGBT for driving a load.

FIG. 3 shows a circuit symbol of an IGBT illustrated in FIGS. 1 and 2. This circuit symbol differs from the circuit symbol for IGBTs, which do not have a further control structure, in that a further control electrode is illustrated in the region of the collector connection, the control connection G2 being connected to the further control electrode.

The functioning of the IGBT illustrated in FIGS. 1 and 2 is explained below with reference to FIG. 4, which illustrates the collector current $I_K$ and signal profiles for a gate drive voltage $V_G$, a drive voltage $V_{G2}$ for the further control connection G2, and also a load path voltage $V_{KE}$ between the collector and the emitter connection K, E. For the purposes of the explanation below, it shall be assumed that the load path or collector-emitter path of the IGBT is connected in series with a load Z as illustrated in a dashed fashion in FIG. 3, between supply voltage terminals V+, GND. Merely for the purposes of the explanation, it shall be assumed that the component is connected as a low side switch, that is to say is connected between the load Z and the negative supply potential connection or reference potential connection GND. In this case, the IGBT serves for switching the load, where a supply voltage present between the supply voltage terminals V+, GND is dropped substantially across the load Z when the IGBT is driven in the on state, and substantially across the load path of the IGBT when the IGBT is driven in the off state.

For the purposes of the explanation below, it shall additionally be assumed that the first emitter zone 11 and the body zone 41 are p-doped and that the second emitter zone 13 or the source zone and the first base 12 are n-doped. The explanations below are also correspondingly applicable to components in which these semiconductor zones are doped complementarily to the doping types mentioned. In this case, the polarities of the voltages explained below should be correspondingly interchanged.

The component turns on—like a conventional IGBT—when a positive voltage is applied between the collector connection K and the emitter connection E and a drive potential suitable for forming a conducting channel in the body zone 41 between the second emitter zone 13 and the first base zone 12 is applied to the gate electrode 42. In the case of a p-doped body zone, the channel is an inversion channel. When the component is in the on state, charge carriers of the first conductivity type, that is to say holes in this example, are injected into the first base zone 12 by the p-type emitter 11, and charge carriers of the second conductivity type, that is to say electrons in this example, are injected into the first base zone 12 by the second emitter 13, via the inversion channel in the body zone 41. These charge carriers injected into the base zone 12 form a so-called charge carrier plasma. A density of the charge carrier plasma is—given otherwise identical component geometry—all the higher, the more effective the p-type emitter 11 is, that is to say the more highly doped the p-type emitter 11 is. As the doping of the p-type emitter 11 increases, therefore, the voltage drop caused by the load current across the first base zone 12 and hence the voltage drop across the collector-emitter path of the IGBT, that is to say the forward voltage of the component, decreases.

The component turns off if the inversion channel in the body zone 41 is interrupted by suitable driving of the gate electrode 42. The gate potential, i.e. the potential of the gate electrode 42, is for example a potential right up to the potential of the emitter electrode 32 or of the n-type emitter 13. In order to form an inversion channel, a positive electrical potential relative to the emitter potential is applied to the gate electrode 42. In order to interrupt the inversion channel, the gate potential 42 is put for example at a potential which corresponds to or even lies below the potential of the emitter connection E. If the component turns off, a space charge zone propagates in the first base zone 12 proceeding from the pn junction between the body zone 41 and the first base zone 12, in which case the charge carriers that are present in the first base zone 12 and form the charge carrier plasma simultaneously have to be carried away. In this example, holes, that is to say p-type charge carriers, have to be carried away via the p-type body zone 41, the losses that arise in this context being all the higher, the more effective the p-type emitter is. The electrons in this example, that is to say n-type charge carriers, have to be carried away via the p-type emitter 11 to the positively charged collector electrode 31, in which case, in turn, holes are injected into the first base zone 12 and the turn-off losses are thereby increased further. In order to reduce these turn-off losses, in the case of the component illustrated in FIGS. 1 and 2 there is the possibility of bridging the p-type emitter 11 before the component is actually turned off, that is to say before the interruption of the inversion channel in the body zone 41, by suitable driving of the further control electrode 21.

For this purpose, a drive potential suitable for forming a conducting channel, in the example an inversion channel, in the p-type emitter 11 between the first base zone 12 and the first connection electrode 31 is applied to the further control electrode 21 via the control connection G2 and the first and second connection zones 23, 25. The p-type emitter 11 is thus ideally bridged, but at the very least its effectiveness is significantly reduced, such that the density of the p-type charge carriers in the first base zone 12 is already significantly reduced upon the driving of the further control electrode, because electrons are guided past the p-type emitter 11 to the collector connection 31. Upon complete bridging of the p-type emitter 11, the component functions like a MOSFET. The on resistance of the component increases after the bridging of the p-type emitter 11, because with the load current initially continuing to flow, holes are carried away from the first base zone 12 in the direction of the body zone 41 and because, owing to the bridging—effective for electrons—of the p-type emitter 11 toward the collector connection 31, no new holes are injected from the p-type emitter 11 into the first base zone 12, such that the density of the charge carrier plasma in the first base zone 12 decreases and the bulk resistance of the first base zone 12 increases. The resultant higher on-state losses are lower, however, than the turn-off losses that would arise without the bridging of the p-type emitter 11.

Figure 4:
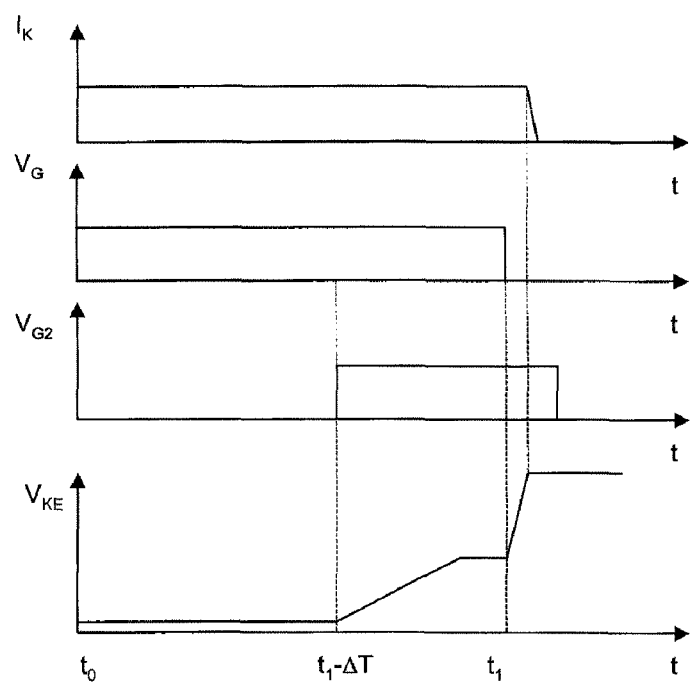
FIG. 4 illustrates the functioning of a semiconductor component embodied as an IGBT on the basis of signal profiles.

FIG. 4 illustrates the driving of the component upon the transition from the on state to the off state by way of example on the basis of signal profiles. The illustration of the signal profiles in FIG. 4 begins at an instant t0, at which the component turns on, which is represented by a high level of the gate drive voltage $V_G$. Starting from an instant t1, the component is intended to be driven in the off state, which is represented by a transition of the gate drive voltage $V_G$ from a high level to a low level in FIG. 4. In order to reduce the turn-off losses, the p-type emitter 11 is bridged by suitable driving of the further control electrode 21 starting from an instant t1-$\Delta$T, which is represented by a high level of the drive voltage $V_{G2}$ of the further control electrode 21 in FIG. 4.

An electrical potential of the further control electrode 21 which is sufficiently positive with respect to the electrical potential of the p-type emitter 11 is required in order to form an inversion channel in the p-type emitter 11. When the component is in the on state, the voltage drop between collector and emitter is in the region of a few volts. The drive potential of the further control electrode 21 that is required for bridging the p-type emitter can be generated for example by a positive voltage being applied between the further control connection G2 and the emitter connection E. The voltage can be chosen to be higher than the gate drive voltage by the voltage drop across the collector-emitter path. Furthermore, the required drive voltage of the control connection G2 is dependent on the doping of the p-type emitter 11 and also on the thickness and on the material of the further dielectric layer 22. In this case, the voltage required for forming a conducting channel in the p-type emitter has to be all the higher, the more highly doped the p-type emitter 11 is and the thicker the further dielectric layer 22 is formed. Advantageously, the doping of the p-type emitter 11 and the thickness of the further dielectric layer 22 can be chosen such that identical drive voltages can be chosen for the driving of the gate connection G and of the control connection G2. Upon the bridging of the p-type emitter 11, the load path voltage $V_{KE}$ of the component rises, as is represented in FIG. 4 starting from the instant t1-$\Delta$T.

After interruption or turn-off of the inversion channel in the body zone 41, the voltage between collector K and emitter E of the component rises and a space charge zone propagates in the first base zone 12 proceeding from the pn junction between the first base zone 12 and the body zone 41. If the electrical potential of the first connection electrode 31 rises with respect to the electrical potential of the second connection electrode 32 when the component is in the off state, then the electrical potential of the further control electrode also rises owing to the capacitive coupling between the p-type emitter 11 or the first connection electrode 31 and the further control electrode 21. If the potential rises above the potential of the second drive connection, then a space charge zone likewise starts to propagate in the first connection zone 23. If a second connection zone 25 doped complementarily to the first connection zone 23 is not present, ionized dopant atoms in the first connection zone 23 in this case find a corresponding counter-charge in the body zone 41. If a second connection zone 23 is present, ionized dopant atoms in the first connection zone 23 find a corresponding counter-charge in the second connection zone 25 and, if appropriate, the body zone 41. The influence of the body zone 41 on the formation of a space charge zone in the first connection zone 23 is in each case all the greater, the thinner the dielectric layer 24 between the body zone 24 and the first connection zone 23.

The first connection zone 23 is of the same conductivity type as the first base zone 12, for example, and can, in particular, be doped approximately identically. In this case, the optional second connection zone 25 is of the same conductivity type as the body zone 41 and, in particular, doped approximately to the same magnitude. In accordance with one example, provision is made for the pn junction between the first connection zone 23 and the optional second connection zone 25 to lie approximately at the level of the pn junction between the first base zone 12 and the body zone 41.

With an increasing space charge zone propagating in the first connection zone 23, the electrical potential of the further control electrode 21 rises in accordance with the electrical potential of the p-type emitter 11 or of the first connection electrode 31, as a result of which a voltage loading of the dielectric layer 22 between the p-type emitter 11 and the further control electrode 21 is kept low. After the turn-off of the component (at the instant t1 in FIG. 4) the drive voltage at the second drive connection G2 can be turned off, that is to say set to a low level, as is illustrated by way of example in FIG. 4. In some cases, the drive voltage at the second drive connection G2 can be turned only after the drive voltage at the gate connection G has been turned off. The drive voltage at the further control connection G2 has to be turned off at the latest before the next turn-on of the component, in order to achieve IGBT operation of the component upon turn-on.

The drive voltage $V_G$ for the gate electrode 42 and the drive voltage $V_{G2}$ for the further control connection G2 are for example voltages relative to emitter potential. Absolute values of these drive voltages lie for example in the range between 5 V and 25 V, in particular between 10 V and 15 V, in order to form an inversion channel in the body zone 41 or in order to bridge the p-type emitter 11. When the component is in the off state and there is therefore a rising potential of the further control electrode 21, the first connection zone 23 "shields" the further control connection G2 from the high potential of the first control electrode 21. Depending on the dielectric strength of the component, the potential difference between the collector and the emitter connection can be up to a few hundred V or up to a few kV. The voltage difference between the first control electrode 21 and the further drive connection G2 can correspondingly likewise be a few hundred V up to a few kV, this voltage difference being taken up by the depletable first connection zone 23. Since the first and second drive voltages $V_G$, $V_{G2}$ can in each case be voltages relative to emitter potential, these drive voltages can be generated by a common drive circuit. In this case, the generation of the drive voltage $V_{G2}$ of the further control electrode G2 can be effected in the same way as the generation of gate drive signals in conventional IGBTs, and so further explanations in this respect are dispensed with.

Referring again to FIG. 1, an optional discharge element 51 can be connected between the control electrode 21 and the first connection electrode 31. The discharge element 51 prevents accumulation of thermally generated charge carriers in the course of a plurality of switching cycles in the first control electrode 21 or the first connection zone 23. In the case of an n-doped first connection zone 23, the charge carriers accumulating in this connection zone are electrons. The discharge element 51 is a diode, for example, which, in the case of an IGBT with an n-doped first connection zone, is connected up in such a way that the electrical potential of the further control electrode 21 cannot fall below the electrical potential of the first connection electrode 31. Instead of a diode, any other rectifier element can be used, or a resistor having a high resistance. The resistance value should be chosen to be low enough that thermally generated charge carriers can flow away to the collector connection 31 without a high voltage drop, and high enough that the leakage current when the control connection G2 is driven in the on state still has tolerable values with regard to the power loss, such as e.g., in the region of a few mA. Typical resistance values can lie between approximately 1 kΩ and approximately 10 MΩ. The discharge element 51 additionally couples the electrical potential of the first connection electrode 31 to the control electrode 21 and thus supports the propagation of a space charge zone in the first connection zone 23 when the component is in the off state.

Optionally, a Zener diode 52 can be connected in series with the discharge element 51, the Zener diode 52 being connected in such a way that the Zener diode 52 allows the electrical potential of the further control electrode 21 to fall below the electrical potential of the connection electrode 31, to be precise by a value corresponding to the breakdown voltage of the Zener diode 52. When the Zener diode 52 is present, this prevents a situation in which, when the component is in the on state, during the time period during which the further control electrode 21 is not driven, and is thus for example at or below the emitter potential, i.e. the potential of the emitter connection, no charge balancing takes place between the control electrode 21 and the collector potential, i.e. the potential of the connection electrode 31. In this case, the Zener diode 52 is suitably dimensioned such that it can take up the potential difference present between the further control electrode 21 and the first connection electrode 31 when the component is in the on state, without breaking down. For this purpose, the breakdown voltage lies for example in the range of between a few volts and approximately 20 V.

In the case of a component in which the individual component zones are doped complementarily to the doping types explained above, the polarities of the diodes 51, 52 should be interchanged. The optional discharge element 51 and the optional Zener diode 52 are merely illustrated on the basis of their circuit symbols in FIG. 1. These components can be realized in any conventional manner and can be connected at any desired position of the control electrode 21 and the connection electrode 31 between these component zones.

Furthermore, the control structure 20 explained above with reference to FIGS. 1 and 2 can also be employed in the case of lateral components, that is to say in the case of components in which the current flow direction, in contrast to the components in accordance with FIGS. 1 and 2, runs in a lateral or horizontal direction of a semiconductor body in which the individual component zones are integrated.

Figure 5:
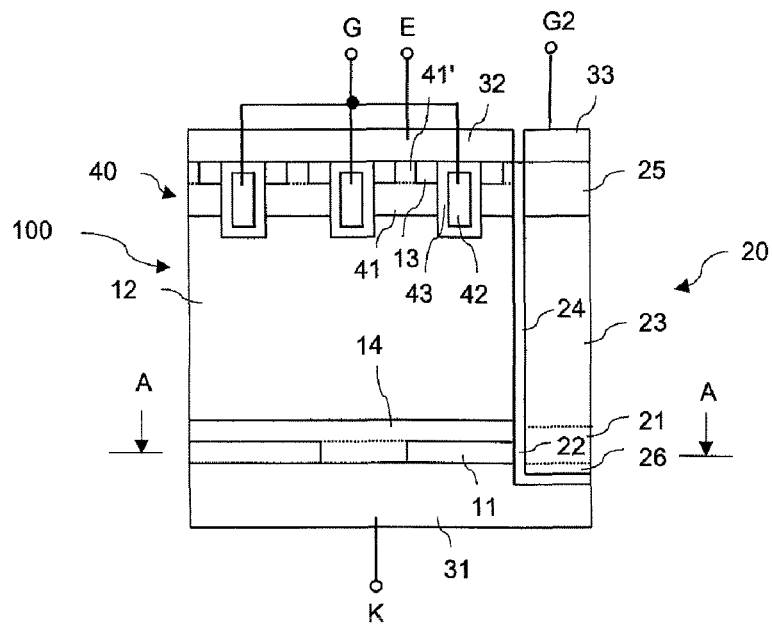
FIG. 5 illustrates a cross-sectional schematic view of a further exemplary embodiment of a semiconductor component realized as an IGBT.

FIG. 5 illustrates a cross-sectional view of a further exemplary embodiment of a component realized as an IGBT. This component differs from the component illustrated in FIGS. 1 and 2 in that the control structure 40 is constructed in a cellular manner and has a multiplicity of control cells of identical type, which are also referred to herein as transistor cells. The individual cells each comprise a gate electrode 42 arranged in a trench, or a section of a gate electrode insulated from the body zone 41 by a gate dielectric 43. Unlike in the case of the components in accordance with FIGS. 1 and 2, in which the inversion channel in the body zone 41 forms in a lateral direction of the semiconductor component, in the case of the component in accordance with FIG. 5, inversion channels form in a vertical direction of the component or semiconductor body 100. The individual control cells each have a second emitter zone 13 or a section of the second emitter zone 13, which are jointly contact-connected by the second connection electrode 32. In the example illustrated, the second connection electrode 32 also makes contact with the body zone 41, and thus short-circuits the body zone and the second emitter zone 13. In the region of the connection of the body zone 41 to the second connection electrode 32, the body zone 41 can have more highly doped sections 41'.

The further control structure 20 illustrated in the case of the component in accordance with FIG. 5 corresponds to the control structure explained with reference to FIGS. 1 and 2, and so the explanations given with regard to the further control structure 20 correspondingly hold true for the component in accordance with FIG. 5. In accordance with the explanations concerning FIG. 1, the control electrode 21 can be realized as a common semiconductor zone with the first connection zone 23, but can also be realized as a zone composed of an electrically highly conductive material (illustrated in a dashed fashion). In the case of the first-mentioned variant, a field stop zone 26 is optionally provided at that end of the first connection zone 23 which is remote from the second connection zone 25. The field stop zone 26 is of the same conductivity type as the first connection zone 23, but doped more highly. When the component is in the off state, the field stop zone 26 prevents the space charge zone that propagates in the first connection zone 23 from extending as far as the dielectric layer 22 between the control electrode 21 and the first connection electrode 31.

Optionally, another field stop zone 14 is present between the first base zone 12 and the first emitter zone 11, the additional field stop zone 14 being of the same conductivity type as the first base zone 12, but doped more highly. When the component is in the off state, the additional field stop zone 14 prevents the space charge zone that propagates in the first base zone 12 from punching through as far as the first emitter 11. Optionally, emitter short circuits (illustrated in a dashed fashion) are present here, in the region of which the field stop zone 14 extends as far as the first connection electrode 31. A doping concentration of the field stop zone 14 is chosen such that an integral of the dopant concentration of the field stop zone 14 and of the first base zone 12 in the current flow direction, that is to say in the vertical direction in the example, is greater than the so-called breakdown charge, which is in the region of $2 \cdot 10^{12}$ cm$^{-2}$ in the case of silicon.

If the control electrode 21 consists of a different material than the first connection zone 23, which is illustrated in a dashed fashion in FIG. 5, then the control electrode 21 extends at least as far as the level of the additional field stop zone 14 and thus at least partly overlaps the field stop zone 14.

The channel cross section of the channel in the first emitter zone 11, which forms in a manner controlled by the first control electrode 21, is dependent on the dimensions of the control electrode 21 in a lateral direction—that is to say in the direction running perpendicularly to the plane of the drawing in the example—along the first emitter zone 11, and dependent on how many control electrodes 21 are provided adjacent to the first emitter zone 11.

Figure 6:
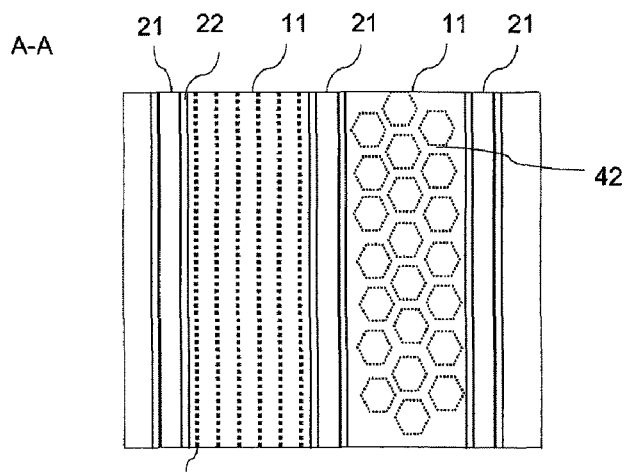
FIG. 6 illustrates a cross section in a sectional plane A-A through the component in accordance with FIG. 5, with a first embodiment variant for the component in accordance with FIG. 5.

FIG. 6 illustrates a cross section in a horizontal sectional plane A-A of FIG. 5, an exemplary embodiment in which a plurality of further control electrodes 21 are provided, which are in each case embodied as elongated strips. In this case, the geometry of the further control electrodes 21 is independent of the geometry of the transistor cells. Thus, there is the possibility, for example, of the individual transistor cells likewise being embodied in a strip-type fashion. This is illustrated in the left-hand part of FIG. 6, where the geometry of the gate electrode 42 is illustrated schematically in order to illustrate the geometry of the transistor cells. The gate electrode 42 is illustrated in a dotted fashion since the gate electrode 42 is situated above the sectional plane A-A in the vertical direction of the component. As is illustrated in the right-hand part of FIG. 6, the individual transistor cells can also be realized as hexagonal cells, that is to say with a gate electrode 42 which, in plan view, has the geometry of a lattice with hexagonal cutouts. Any other conventional transistor cell geometries can likewise be employed in connection with the component explained.

Figure 7:
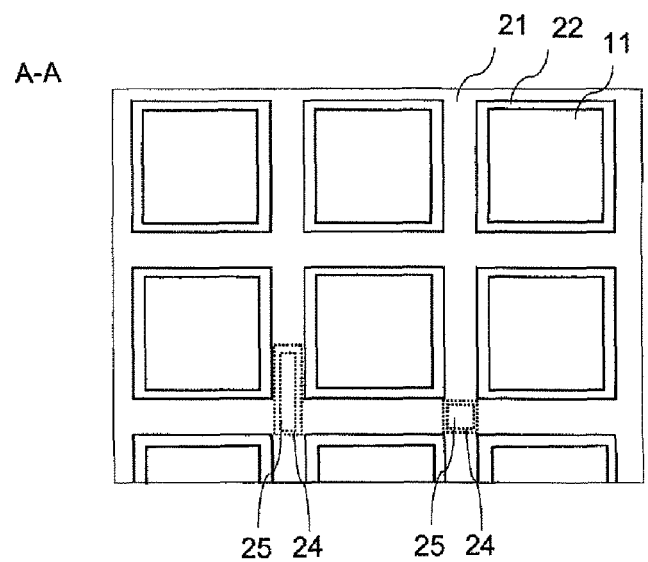
FIG. 7 illustrates a cross section in a sectional plane A-A through the component in accordance with FIG. 5, with a second embodiment variant for the component in accordance with FIG. 5.

FIG. 7 illustrates a cross section in the sectional plane A-A of FIG. 5, a component that differs from that illustrated in FIG. 6 in that the further control electrode 21 has a grid-type geometry in plan view. In the example illustrated, the grid is rectangular, in particular a square grid. However, the grid could also have some other grid geometry.

Figure 8:
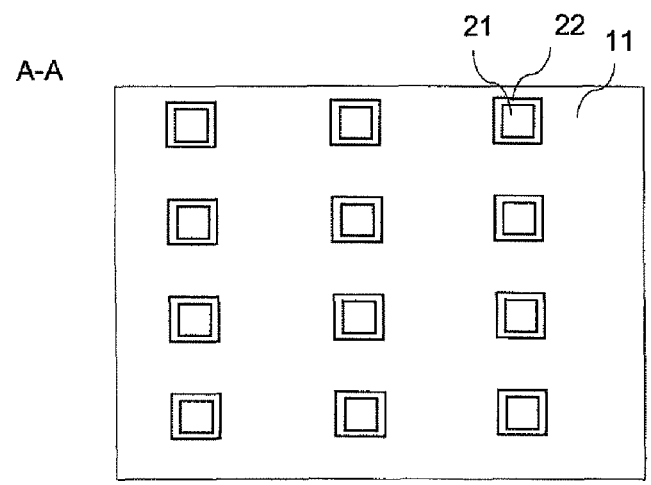
FIG. 8 illustrates a cross section in a sectional plane A-A through the component in accordance with FIG. 5, with a third embodiment variant for the component in accordance with FIG. 5.

FIG. 8 illustrates a further example of a semiconductor component on the basis of a cross section in the sectional plane A-A of FIG. 5. In the case of this component, the individual further control electrodes 21 are embodied in pillar-type fashion. These pillars have a rectangular, in particular square, cross section in the example illustrated, but could also have any other cross section, such as e.g., a circular cross section. In this case, the geometry of the transistor cells, which are not illustrated in FIGS. 7 and 8, is totally independent of the geometry of the control electrodes 21.

The geometry of the first and second connection zones 22, 25 can correspond to the geometry of the further control electrode 21. In this case, a first and a second connection zone 23, 25 are always present above the further control electrode 21.

Figure 9:
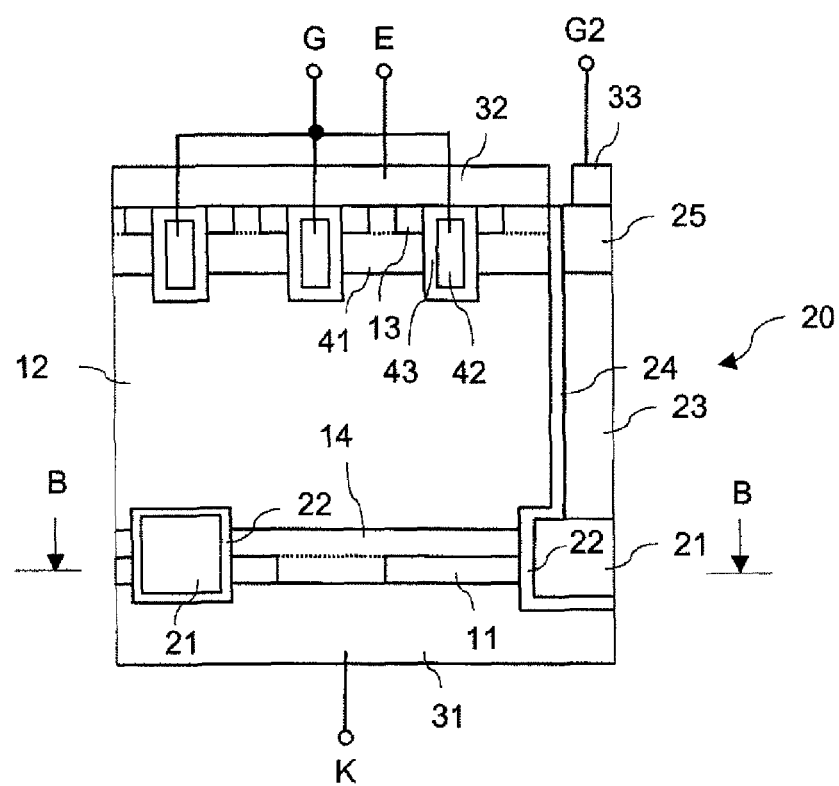
FIG. 9 illustrates a cross-sectional schematic view of a further exemplary embodiment of a semiconductor component realized as an IGBT.

FIG. 9 illustrates a vertical cross-sectional illustration of a further example of a semiconductor component, where contact can be made with the further control electrode 21 only in sections by means of the first connection zone 23. In this case, there are sections of the control electrode 21 which are arranged below the transistor cell array—as is illustrated in the left-hand part of FIG. 9—and which are electrically conductively connected to such a section which is connected via the connection zones 23, 25 to the control connection G2. This embodiment considerably reduces the input capacitance with respect to the control connection G2. The input capacitance is the sum of the capacitance $C_{G2K}$ between the control connection G2 and the collector K and the capacitance $C_{G2E}$ between the control connection G2 and the emitter E. Moreover, the active area for the flow of the load current is reduced to a lesser extent, since the control structure 20 takes up less space in the first and second base zones 11, 41.

Figure 10:
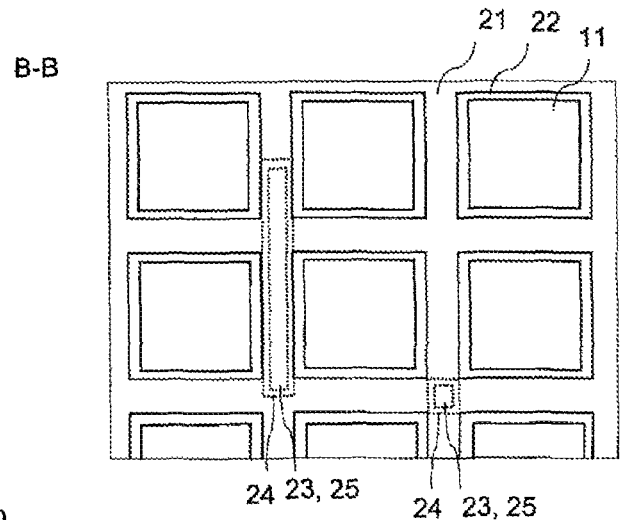
FIG. 10 illustrates a cross section in a sectional plane B-B, with a first embodiment variant for the component in accordance with FIG. 9.

FIG. 10 shows a horizontal cross section through the component in accordance with FIG. 9 in a sectional plane B-B. The control electrode 21 is formed as a grid-type or lattice-type electrode according to this embodiment e.g., in a horizontal plane. The first and second connection zones, which are illustrated in a dotted fashion in FIG. 10, and which enable contact to be made with the guide electrode 21 via the front side of the component, can be embodied for example as pillar-type zones (as is illustrated in FIG. 10). The first and second connection zones can also have a different geometry, such as e.g., a strip-type geometry, as is illustrated in the left-hand part of FIG. 10.

The thickness of the dielectric 24 in the region of the first connection zone 23 can differ significantly from the thickness of the dielectric 22 in the region of the further control electrode 21. In particular, the dielectric 24 can be made significantly thicker than the dielectric 22, as a result of which a capacitive coupling between the first connection zone 23 and the first base zone 12 can be reduced. Such a capacitive coupling between the first connection zone 23 and the first base zone 12 is not necessary for proper functioning of the component. In this context, the arrangement of the first connection zone 23 adjacent to the first base zone 12 should be understood merely as an example. The spatial arrangement of the zones 12, 23 could also be effected differently, provided that the first connection zone 23 can take up a reverse voltage when the component is in the off state.

Figure 11A:
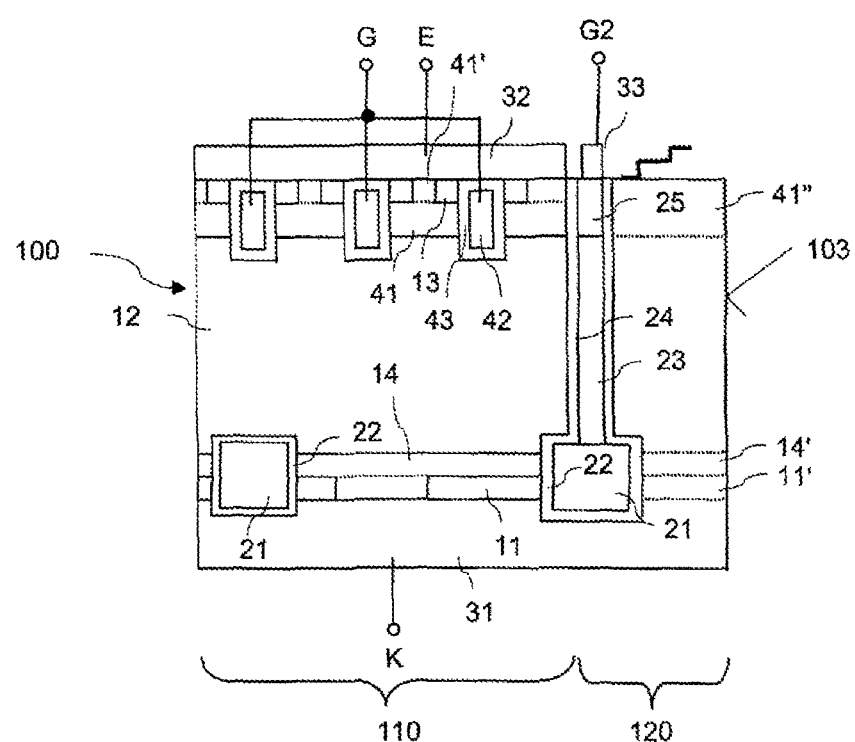
FIGS. 11A and 11B illustrate a cross sectional schematic view of a further exemplary embodiment of a semiconductor component.

FIG. 11A shows a vertical cross-sectional illustration of a further exemplary embodiment of a semiconductor component. The semiconductor body 100, in which the component zones of this component are integrated, has an inner region 110 and an edge region 120. The edge region 120 is arranged between the inner region 110 and an edge area or a side area 103 of the semiconductor body 100. The active component zones of the component, such as the first and second emitter zones 11, 13, the first base zone 12, the body zone 41 and the gate electrode 42, are arranged in the inner region of the component 110. A doping of the semiconductor body 100 in the edge region 120 corresponds for example to a doping of the first base zone 12. The presence of a doped zone 11' in the edge region, which doped zone 11' corresponds to the first emitter zone 11 with regard to its doping, is optional, as is the presence of a doped zone 14' whose doping corresponds to that of the field stop zone 14.

In the region of the front side 101, a doped zone 41" is optionally present in the edge region, the optional doped zone 41" corresponding to the body zone 41 with regard to its doping. Optionally, the component additionally has in the edge region lateral edge termination structures, such as e.g., field plates (illustrated schematically), field rings, doping regions in the semiconductor, and/or covering or passivation layers (none of which is illustrated).

Figure 11B:
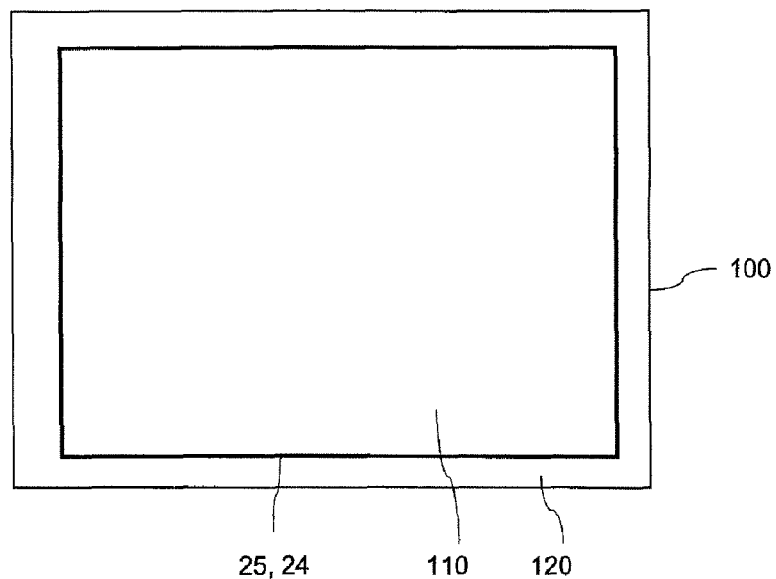

The first and second connection zones 23, 25, which connect the control electrode 21 to the control connection G2, are arranged between the inner region 110 and the edge region 120 and surround the inner region 110 in a ring-shaped manner. This is illustrated schematically in FIG. 11B on the basis of a plan view of the semiconductor body 100. The second connection zone 25, which extends as far as the front side, and the dielectric layer 24 delimiting the second connection zone 25 in a lateral direction are depicted as a thick line in the schematic illustration in accordance with FIG. 11B. For reasons of clarity, further component zones are not shown in the illustration in accordance with FIG. 11B.

Referring again to FIG. 11A, the dielectric layer 24, which dielectrically insulates the first and second connection zones 23, 25 from remaining regions of the semiconductor body, in the case of this component forms a dielectric insulation between the inner region 110 and the edge region 120 of the component. This insulation prevents the edge region 120 of the component from being flooded by charge carriers when the component is in the on state. The switching robustness of the component can thereby be increased. Moreover, this prevents a situation in which, in the edge region 120, a charge carrier plasma forms which does not contribute to the current transport when the component is in the on state, which, particularly in the case of small components, that is to say in the case of components in which the edge region 120 occupies a comparatively large area of the total area of the component, leads to an improved ratio between switching losses and on-state losses. Furthermore, the component can be controlled better if the edge region 120 is not flooded by charge carriers.

The presence of the first and second connection zones 23, 25 enclosing the inner region 110 in a ring-shaped fashion does not preclude a situation in which still further first and second connection zones 23, 25 are present in the inner region 110, which serve, in the inner region 110, to make contact with individual sections of the control electrode 21.

The dielectric layer 24 can be designed, in the edge region 120, to take up the entire voltage present between the inner region 110 and the edge region 120, that is to say the entire collector-emitter voltage, in the off-state case of the component. In this case, the dielectric layer 24 can be formed thicker in the edge region 120 than in remaining regions of the component. In order to take up a reverse voltage of 1 kV, for example, the thickness of the dielectric layer 24 can be approximately 2.5 µm. Provided that the dielectric layer 24 is suitable for taking up the reverse voltage of the component in the edge region 120, the dielectric layer 24 serves as an edge termination, such that further edge termination structures such as e.g., field plates or field rings can be dispensed with, if appropriate, or that further edge termination structures can be reduced with regard to their dimensions.

If the dielectric layer 24 does not have to take up the reverse voltage, for example in the inner region 110 or if other edge termination structures are present, a thickness in the range of a few 100 nm is sufficient for the dielectric layer 24.

Figure 12:
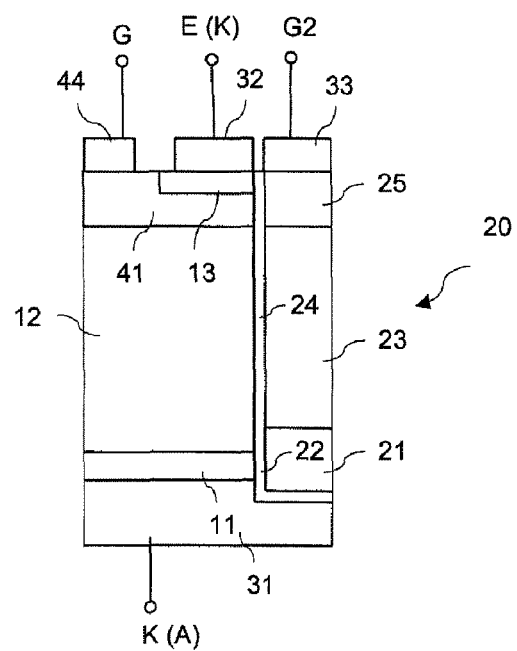
FIG. 12 illustrates a cross-sectional schematic view of an exemplary embodiment of a semiconductor component embodied as a thyristor.

The above-explained concept of bridging, by means of a control structure 20, an emitter zone 11 of a bipolar component shortly before the component is turned off is not restricted to IGBTs. Referring to FIG. 12, this concept can for example also be employed in the case of thyristors, in particular in the case of GTOs (Gate Turn-Off Thyristor). In principle, a thyristor differs from an IGBT in that, in the case of a thyristor, no inversion channel is to be controlled in the second base zone. Instead, a triggering connection or gate connection for triggering the component is present. The triggering connection is, in the case of a GTO, an electrical connection 44 of the base zone 41, as is illustrated in FIG. 12. A thyristor which is not intended to be turned off in a gate-controlled manner can also be equipped with some other triggering structure, such as, for example, a light triggering structure (not illustrated). The doping types and the doping concentration of the first emitter 11, the second emitter 13, the first base 12 and the second base 41 are, for example, in accordance with those of the IGBT explained above. The emitter connection E of a thyristor is also referred to as cathode connection K, and the collector connection K of a thyristor is also referred to as anode connection A.

The further control structure 40 having the further control electrode 21 serves for controlling a conducting channel in the first emitter zone 11, for example shortly before the component is turned off. A GTO can be driven in the on state and in the off state in a sufficiently known manner by suitable driving of the gate electrode 44, G.

With regard to the functioning and the configuration of the further control structure 20, the description made above in connection with the IGBT are correspondingly applicable.

Figure 13:
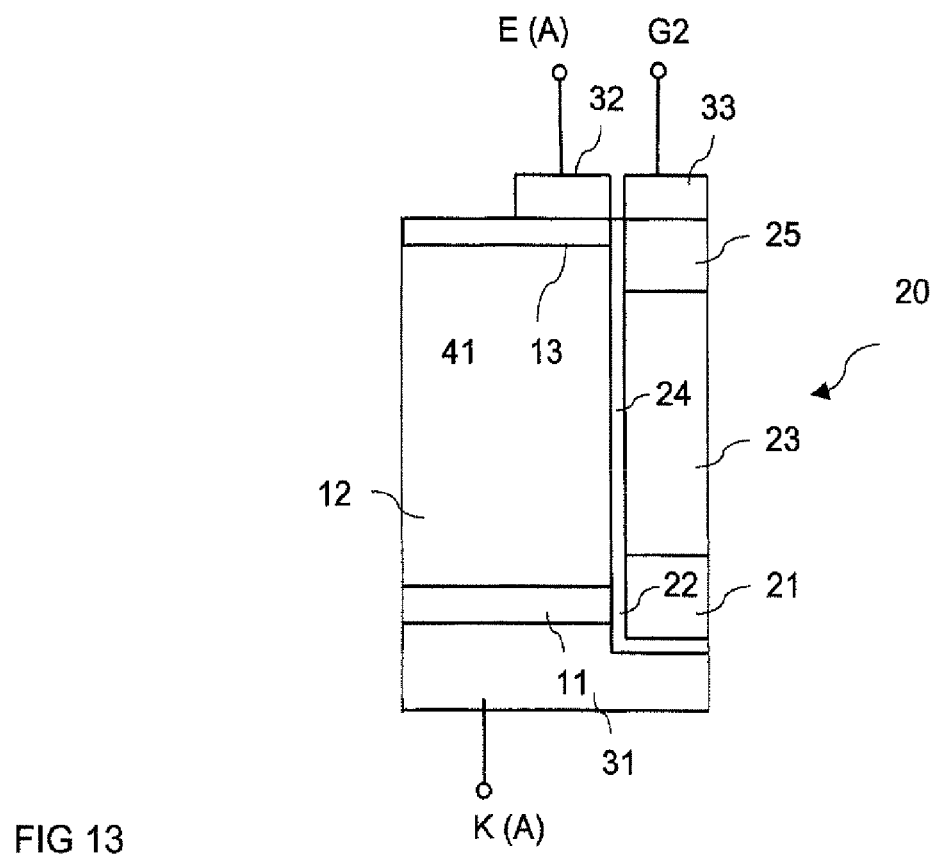
FIG. 13 illustrates of a cross-sectional schematic view of an exemplary embodiment of a semiconductor component embodied as a diode.

Referring to FIG. 13, which is a cross section through a component embodied as a diode, the control concept using the control structure 20 explained previously herein, can also be employed in the case of a diode. In the case of a diode, the control structure 20 serves for example for the controlled bridging of an n-doped first emitter zone 11. In the case of the component illustrated in FIG. 13, the first emitter zone 11, to which the control electrode is arranged adjacent, is therefore n-doped, for example. The first base zone 12 is n-doped or p-doped, and the second emitter zone 13 is doped complementarily to the first emitter zone 11, that is to say p-doped, for example. A second base zone is not present in the case of a diode. The first emitter zone 11 is contact-connected by the first connection electrode 31, which forms a cathode connection K in the case of an n-doped first emitter zone 11 and the second emitter zone 13 is contact-connected by the second connection electrode 32, which forms an anode connection A in the case of a p-doped second emitter zone 11.

For the purpose of bridging the n-type emitter 11, a negative potential relative to the potential of the cathode connection is to be applied to the control electrode 21 via the control connection G2. In the case of the component illustrated, the first connection zone 23 is n- or p-doped, for example, and the optional second connection zone 25 is p-doped, for example. With regard to the doping concentrations of the individual component zones of the diode structure and the control structure, the description above with regard to the IGBT are correspondingly applicable.

Spatially relative terms such as "under", "below", "lower", "over", "upper" and the like, are used for ease of description to explain the positioning of one element relative to a second element. These terms are intended to encompass different orientations of the device in addition to different orientations than those depicted in the Figs. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    a semiconductor body having opposing first and second main sides, the first and second main sides being bounding surfaces of the semiconductor body;
    a first emitter zone of a first conductivity type arranged in the semiconductor body and extending to the first main side of the semiconductor body;
    a first connection electrode contact-connected to the first emitter zone at the first main side of the semiconductor body, the first connection electrode comprising a metal;
    a second emitter zone of a second conductivity type different from the first conductivity type arranged in the semiconductor body and extending to the second main side of the semiconductor body;
    a first base zone arranged between the first and second emitter zones and extending to the second main side of the semiconductor body; and
    a first control structure insulated from the first base zone and comprising:
        a control electrode arranged adjacent the first emitter zone in the semiconductor body, the control electrode being insulated from the first emitter zone by a first dielectric layer and extending in a current flow direction of the semiconductor component from along part of the first base zone and along the first emitter zone as far as or into the first connection electrode at the first main side of the semiconductor body;
        a first control connection at the second main side of the semiconductor body; and
        at least one first connection zone arranged between the first control connection and the control electrode and comprising a semiconductor material,
        wherein the first control structure extends uninterrupted from a first plane coplanar with the first main side of the semiconductor body to a second plane coplanar with the second main side of the semiconductor body.

2. The semiconductor component as claimed in claim 1, wherein the first base zone is more lightly doped than the first emitter zone and/or the second emitter zone.

3. The semiconductor component as claimed in claim 1, wherein the control electrode is arranged adjacent the first base zone and insulated from the first base zone by a second dielectric layer.

4. The semiconductor component as claimed in claim 1, wherein the at least one first connection zone and the control electrode are formed by a common semiconductor zone.

5. The semiconductor component as claimed in claim 1, wherein the control electrode comprises a metal or a doped polycrystalline semiconductor material.

6. The semiconductor component as claimed in claim 1, wherein the first connection zone comprises a monocrystalline semiconductor material.

7. The semiconductor component as claimed in claim 6, wherein the first connection zone is doped so that the first connection zone is fully depletable.

8. The semiconductor component as claimed in claim 6, wherein the first control structure further comprises a second connection zone doped complementarily to the at least one first connection zone and arranged at least in sections between the at least one first connection zone and the first control connection.

9. The semiconductor component as claimed in claim 1, wherein the at least one first connection zone is of the second conductivity type.

10. The semiconductor component as claimed in claim 1, wherein the semiconductor component is an insulated gate bipolar transistor and the first base zone is of the second conductivity type, the semiconductor component further comprising:
    a second control structure comprising:
        a second base zone of the first conductivity type arranged between the first base zone and the second emitter zone; and
        a gate electrode insulated from the second base zone by a second dielectric layer, the gate electrode extending adjacent the second base zone from the second emitter zone as far as the first base zone.

* * * * *